(12) United States Patent
Colombo

(10) Patent No.: US 7,900,520 B2
(45) Date of Patent: Mar. 8, 2011

(54) PRESSURE SENSOR DEVICE

(75) Inventor: Paolo Colombo, Alessandria (IT)

(73) Assignee: Eltek S.p.A., Casale Monferrato (Alessandria) (IT)

( * ) Notice: Subject to any disclaimer, the term of this patent is extended or adjusted under 35 U.S.C. 154(b) by 91 days.

(21) Appl. No.: 12/487,347

(22) Filed: Jun. 18, 2009

(65) Prior Publication Data

US 2009/0314096 A1 Dec. 24, 2009

(30) Foreign Application Priority Data

Jun. 19, 2008 (IT) ............................. TO2008A0485
Jun. 16, 2009 (EP) ................................... 09162876

(51) Int. Cl.
*G01L 9/00* (2006.01)
*H01L 21/02* (2006.01)

(52) U.S. Cl. ................ 73/754; 73/756; 438/50; 257/419

(58) Field of Classification Search ........................ None
See application file for complete search history.

(56) References Cited

U.S. PATENT DOCUMENTS

| | | | |
|---|---|---|---|
| 5,351,550 A * | 10/1994 | Maurer | 73/727 |
| 6,212,946 B1 | 4/2001 | Naegele et al. | |
| 6,272,913 B1 | 8/2001 | Naegele et al. | |
| 2006/0243054 A1* | 11/2006 | Saito et al. | 73/754 |
| 2007/0193359 A1* | 8/2007 | Asada et al. | 73/754 |
| 2008/0178681 A1* | 7/2008 | Asada et al. | 73/754 |
| 2009/0072333 A1* | 3/2009 | Haag et al. | 257/415 |
| 2009/0314096 A1* | 12/2009 | Colombo | 73/754 |

* cited by examiner

*Primary Examiner* — Andre J Allen
(74) *Attorney, Agent, or Firm* — Heslin Rothenberg Farley & Mesiti P.C.; Victor A. Cardona, Esq.

(57) ABSTRACT

A semiconductor pressure sensor for a pressure sensor device has a pressure detection element which includes a membrane made of semiconductor material, particularly silicon. The sensor includes a support having a three-dimensional body passed through by a detection passage. The detection element is made integral with a first end face of the three-dimensional body, substantially at a respective end of the detection passage. The support is configured to serve the function of a mechanical and/or hydraulic adaptor or interface, with the aim of mounting the sensor into a pressure sensor device, particularly to allow mounting the pressure sensor into a pressure sensor device configured for mounting a sensor of the type referred to as monolithic or ceramic.

20 Claims, 9 Drawing Sheets

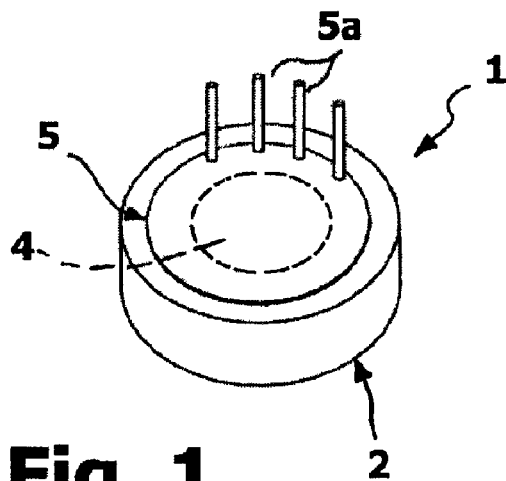
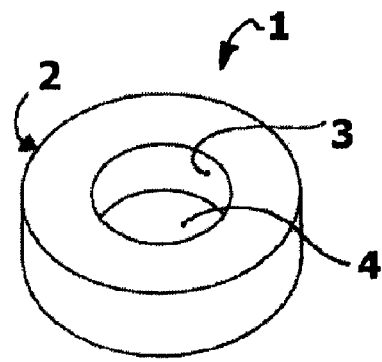
Fig. 1  Fig. 2
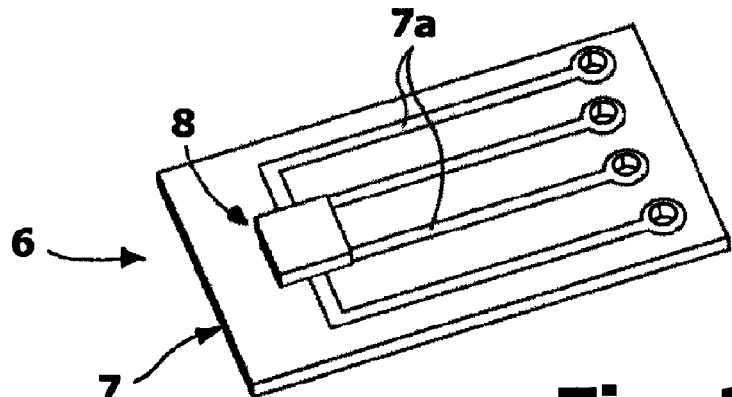
Fig. 3
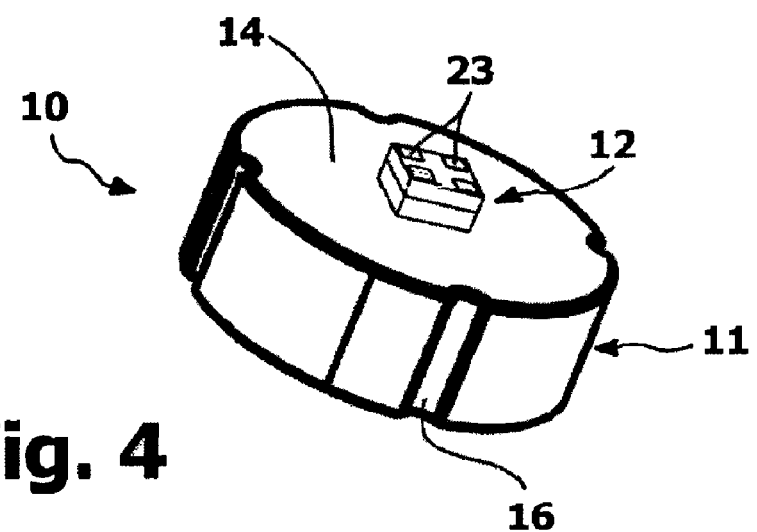
Fig. 4

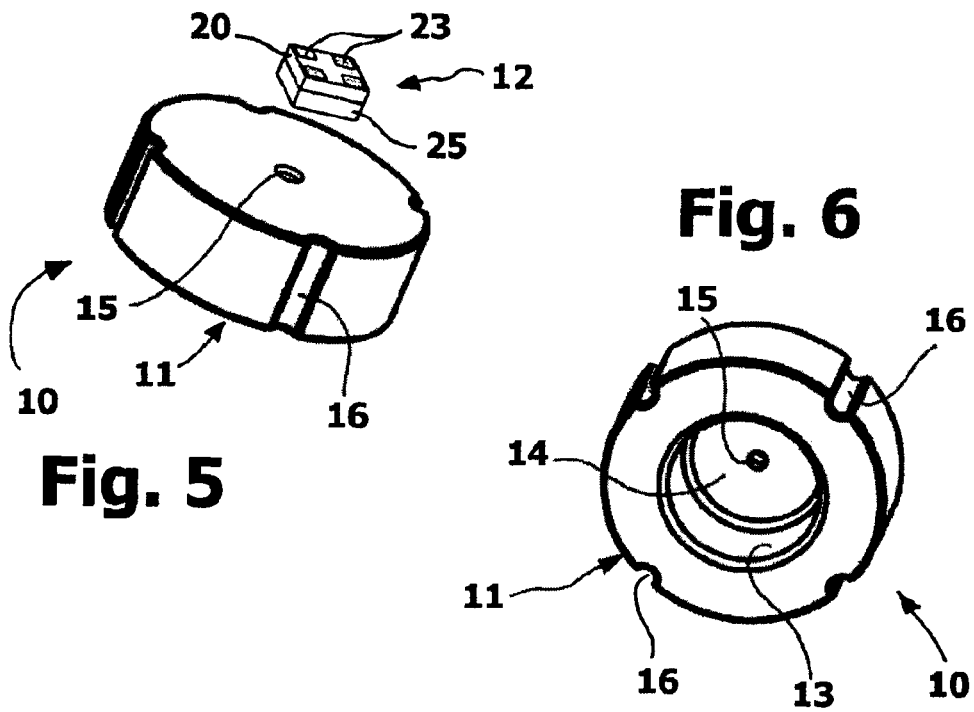
Fig. 5
Fig. 6
Fig. 7
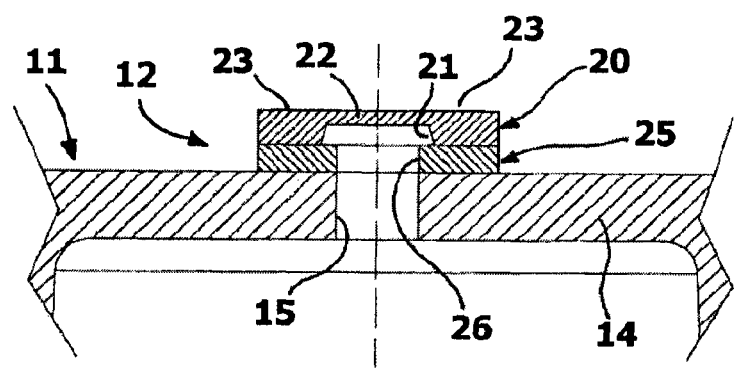
Fig. 8

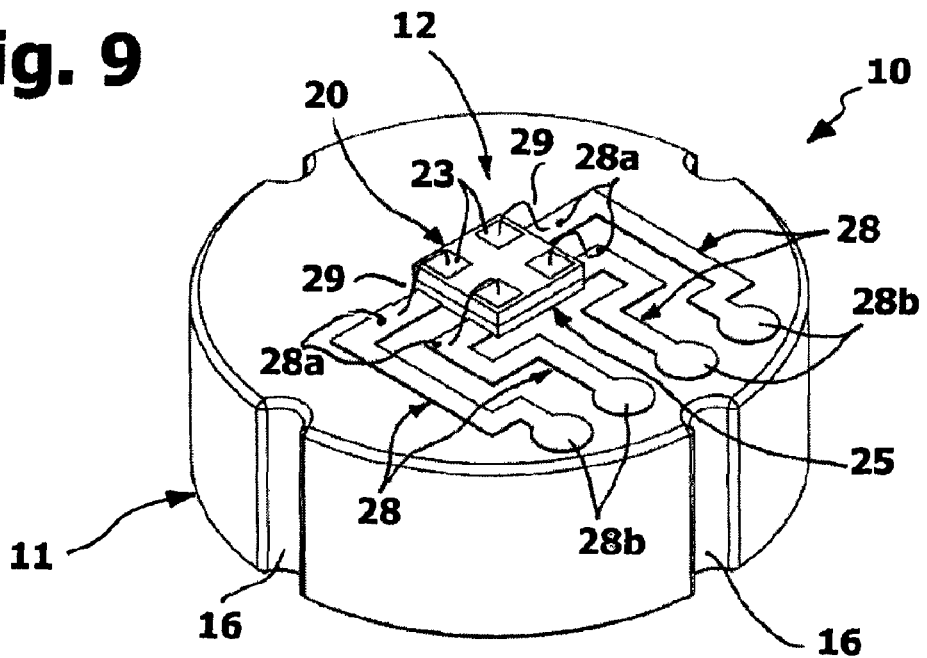
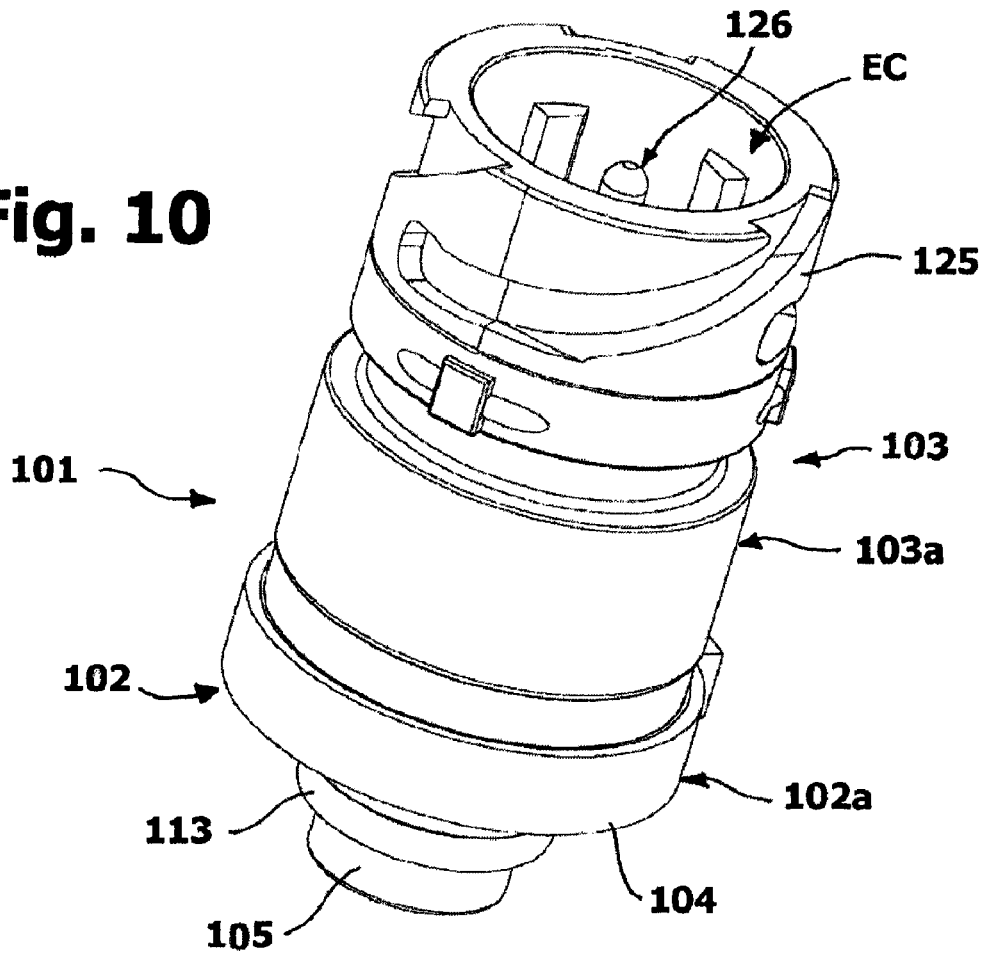

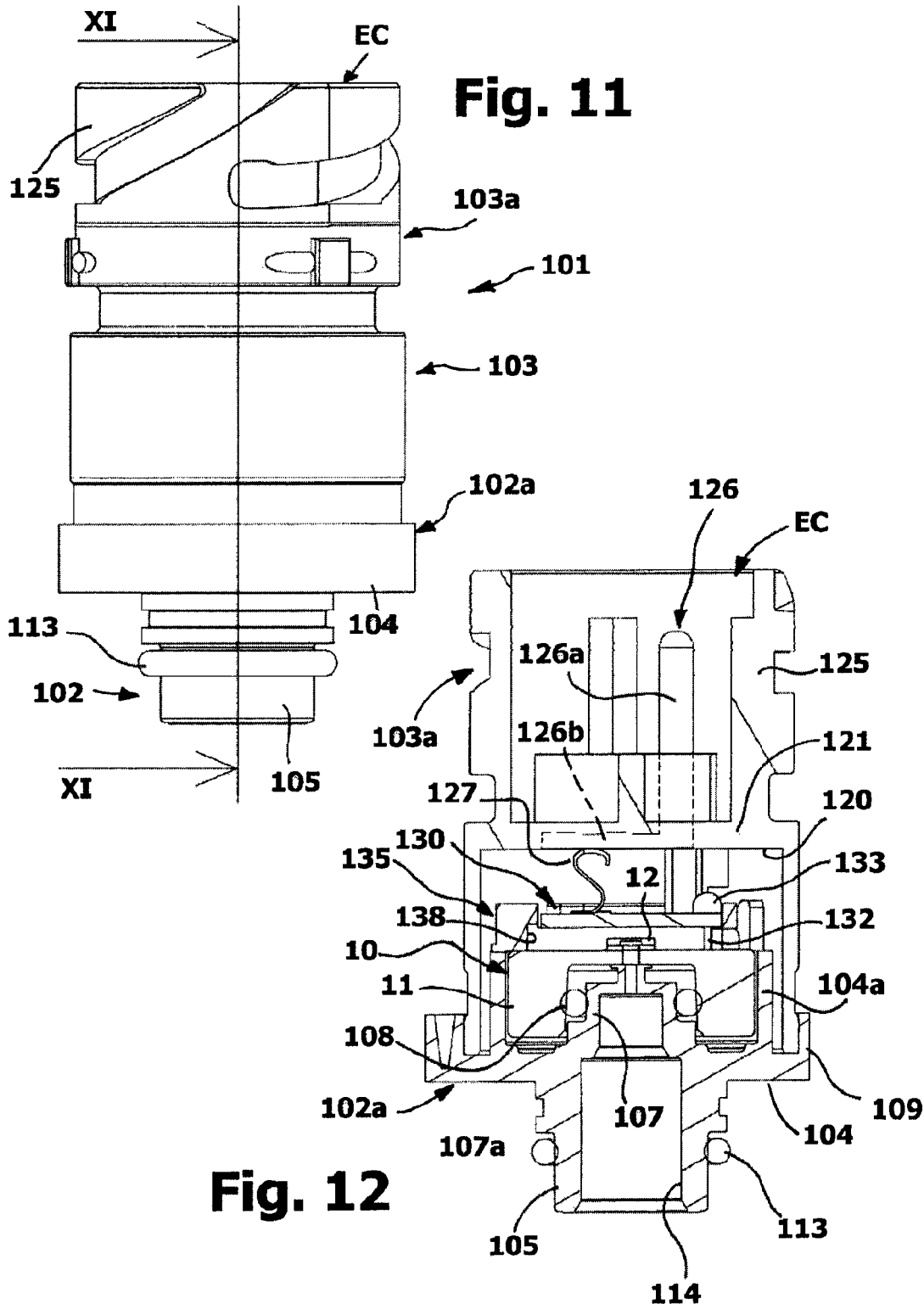

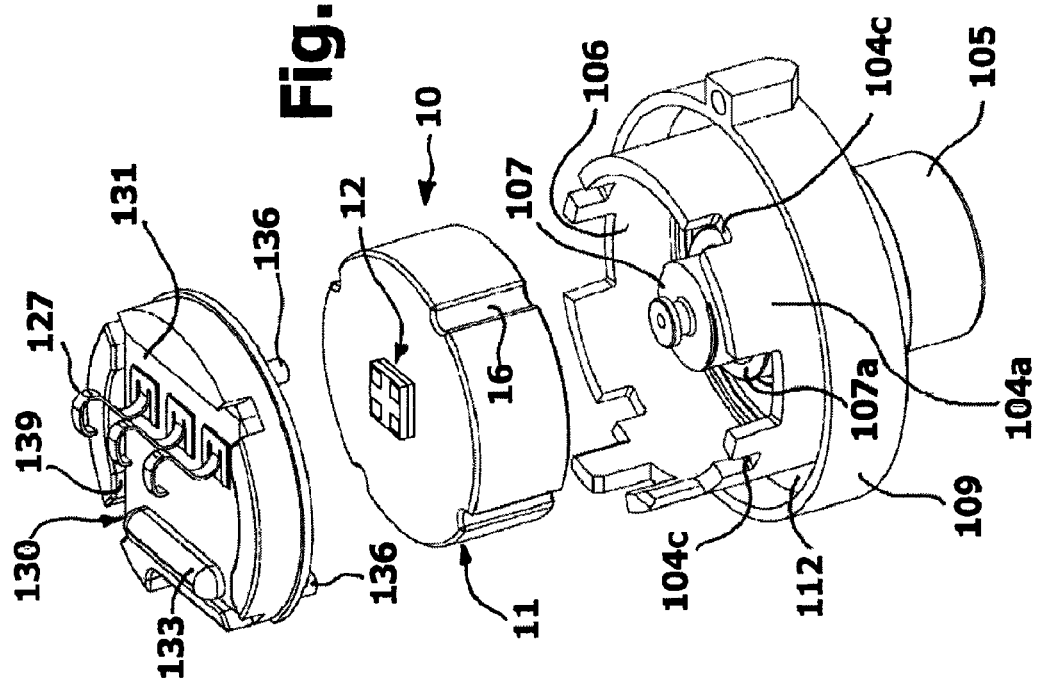
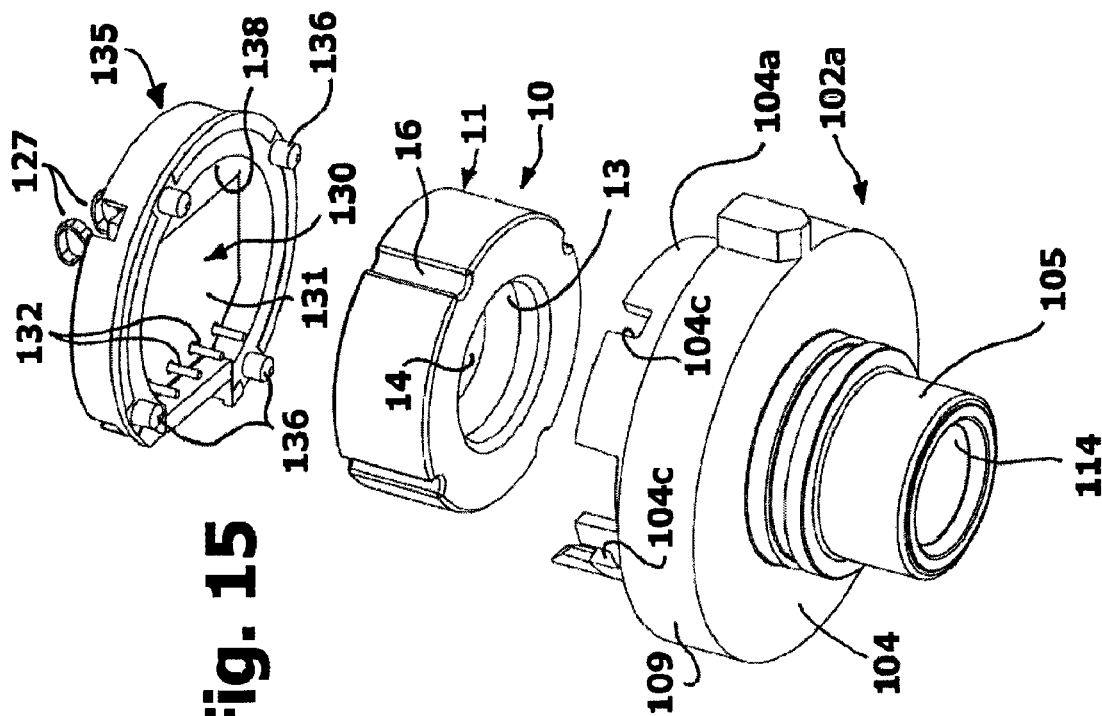

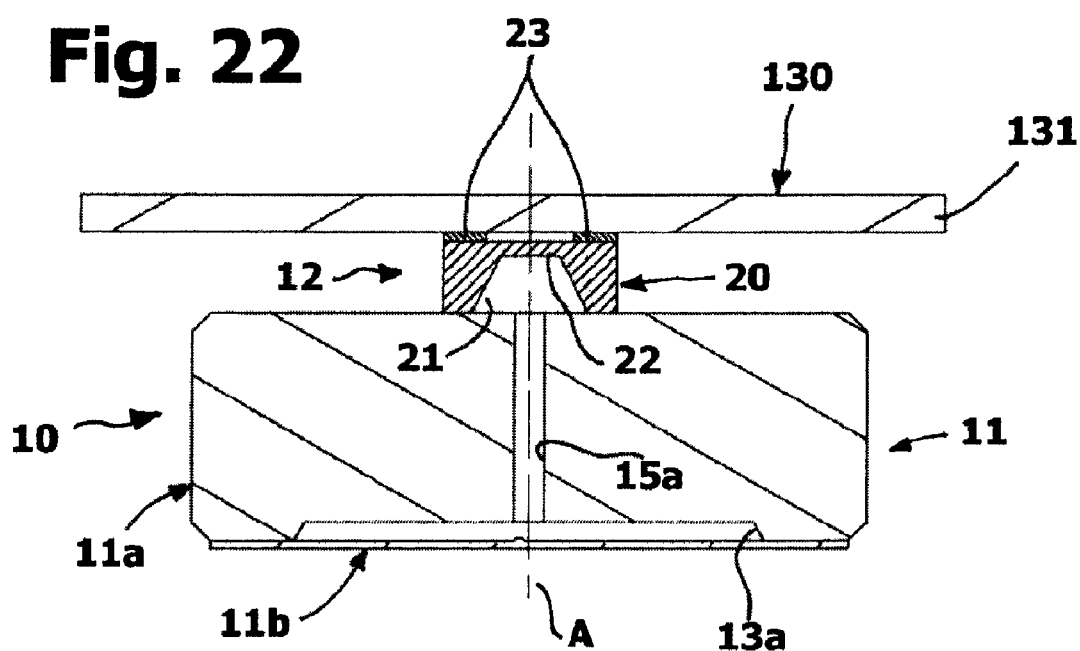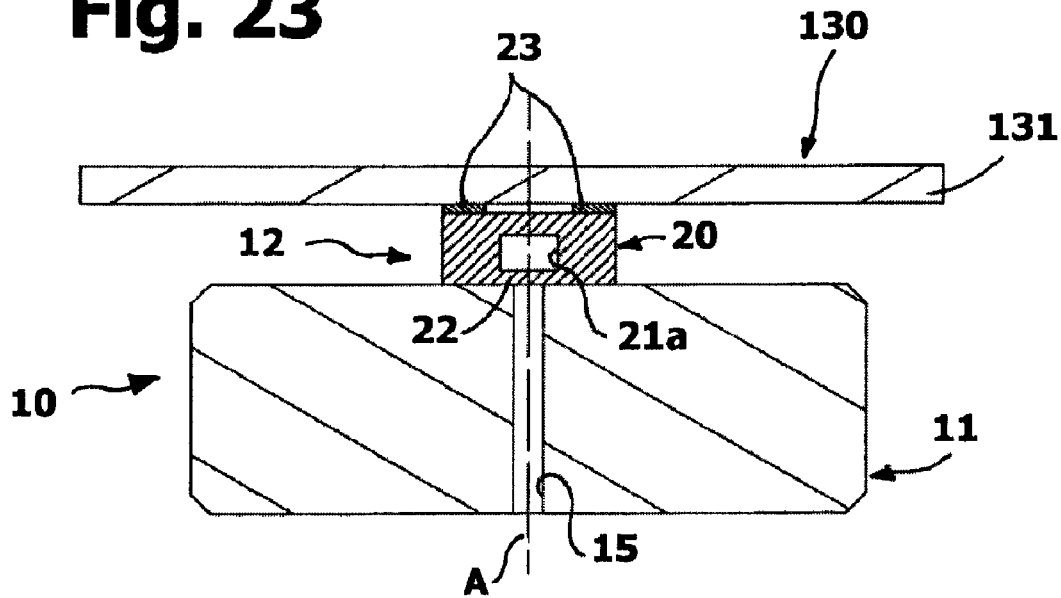

PRESSURE SENSOR DEVICE

CROSS-REFERENCE TO RELATED APPLICATIONS

This application claims priority from Italian patent application No. TO2008A000485, filed on Jun. 19, 2008, and European Patent Application No. EP 09162876.8 filed Jun. 16, 2009, the entire disclosures of which are incorporated herein by reference.

FIELD OF THE INVENTION

The present invention refers to a pressure sensor device and to a semiconductor pressure sensor for making such device. Devices of the mentioned type are used in various industries for detecting the pressure of fluids (liquid and aeriform), such as in the automotive industry, household and household appliances industry, air conditioning and in the hydro-sanitary-heating industry in general.

BACKGROUND ART

These detection devices typically comprise a casing, defining a chamber having an inlet for a fluid to be subjected to pressure measurement, a pressure sensor accommodated in the casing and a circuit arrangement, to which the pressure sensor is electrically connected; the circuit arrangement typically includes a printed circuit board at least partially accommodated in the chamber of the casing.

Two types of sensors, referred to herein as "monolithic sensors" and "semiconductor sensors" for the sake of simplification, are mainly used for the production of the indicated detection devices. The characteristic that immediately distinguishes the two types of sensors are the dimensions, the semiconductor sensors being definitely smaller with respect to monolithic sensors.

A typical monolithic sensor is schematically represented in FIGS. 1 and 2, where it is indicated in its entirety with 1. Such sensor typically comprises a monolithic body 2, generally cylindrical shaped and usually made of ceramic material (as a matter of fact, sensors of the type in question are also referred to as "ceramic sensors"). The monolithic body 2 has a blind cavity 3, having a substantially circular section, closed at an end by a membrane portion 4 of the monolithic body 2. An electrical detection component, capable of generating a signal representing a flexure of the membrane portion 4, is provided for at the membrane portion 4; the components used for such purpose are typically selected from among resistor elements, capacitive elements and piezo-resistive elements. The detection component (or a group of such elements) is mounted on a printed circuit board, indicated with 5 in FIG. 1, provided with terminals or pins 5a, which is fixed on the face of the monolithic body 2 opposite to the opening of the cavity 3, in such a manner that the detection element adheres to the surface of the membrane portion 4 outside the cavity 3, so as to be able to detect any flexures thereof.

The sensor 1 is mounted inside the chamber of the detection device in such a manner that the open end of the blind cavity 3 is directly in communication with the inlet conduit of the detection device: for this purpose, the inlet conduit usually has a tubular end part, on which the sensor body 2 is coupled at the open part of the cavity 3. The sensor 1 is connected, through the pins 5a of the circuit 5, to another printed circuit board, present inside the casing, the other circuit in turn being connected to an electric connector of the device; alternatively, the pins 5a may be directly connected to the electric terminals of an electric connector of the device.

When using the sensor device the pressure of the fluid present in the inlet conduit is such to cause a flexure of the membrane portion 4 of the sensor and the degree of such flexure, which depends on the pressure of the fluid, is measured through the detection element belonging to the circuit 5. Through the pins 5a, the output signal of the detection element, representing the pressure value and possibly amplified and/or conditioned by means of suitable components of the circuit 5, reaches the abovementioned other printed circuit board and/or the abovementioned electric connector, through which the sensor device is connected to an external system, such as for example an automobile engine control unit.

The main advantages of the monolithic sensors include easy fixing, capacity to resist against fluids aggressive from a chemical point of view and the optimal general mechanical resistance, which facilitates manipulation and mounting the component during the production of the pressure detector device.

Regarding the semiconductor pressure sensors instead, they are substantially configured as integrated circuits or chips and thus they are definitely smaller with respect to a monolithic sensor, though they also have a deformable detection membrane.

The sensor body is in this case made up of a so-called "die", i.e. a small block or plate made of semiconductor material, typically silicon, which defines a detection membrane. Also the die of a semiconductor pressure sensor may be made in such a manner to define a small cavity closed at an end by a respective membrane portion, or the die may form the membrane alone and be fixed, for example glued, on a respective substrate, typically made of glass, defining an axial cavity.

Directly obtained on the die made of semiconductor material is the miniaturised electric circuit of an integrated circuit serving to detect the degree of deformation of the detection membrane. The die may also be enclosed in a respective casing or container, referred to as "package", projecting from which are the connection terminals (pins), conceived to connect the die itself to a circuit support, of the printed circuit board intended to be mounted inside the respective pressure sensor device.

As an example, FIG. 3 schematically illustrates a printed circuit board 6 provided for use in a pressure detector device. The circuit 6 comprises circuit support, or PCB (Printed Circuit Board) or terminal board 7, for example made of glass fibre, provided with electrically conductive tracks 7a at the surface, connected to which are the electrical connections or pins (not shown) of a semiconductor pressure sensor, indicated in its entirety with 8, showing only the package. Devices of this type are described, for example in U.S. Pat. Nos. 6,272,913 B1 and 6,212,946 B1.

The semiconductor pressure sensors allow directly obtaining or integrating the detection circuit components on the die, comprising those for possibly amplifying and/or conditioning the signal, allowing reducing production costs. However, due to the miniaturised dimensions and the inherent fragility of this type of components, the semiconductor sensors complicate, from an industrial point of view, the production of pressure sensor devices to an extent. For example, the semiconductor pressure sensors should be mounted on a printed circuit board support of the pressure sensor device, with such circuit support required to be positioned in such a manner to face or to be extended at least partially inside a detection chamber defined in the casing of the device itself, whose chamber is in communication with the inlet conduit of the fluid. This need complicates the production of the pressure sensor device. Furthermore, especially in case of devices provided for detecting the pressure of liquids, particular expedients for sealed insulation of the part of the circuit that supports the pressure sensor must be provided for (for such purpose see the abovementioned U.S. Pat. Nos. 6,272,913 B1 and 6,212,946 B1).

SUMMARY OF THE INVENTION

An aim of the present invention is that of providing a semiconductor pressure sensor that is easy to make, reliable in use, easier to use and more flexible with respect to homologous sensors of the known type. Another aim of the present invention is that of providing a semiconductor pressure sensor of a particularly advantageous construction regarding the manufacture of a pressure sensor device. Another aim of the invention is that of providing a pressure sensor device, comprising a semiconductor pressure sensor, that is easier to manufacture with respect to the prior art. Another aim of the invention is that of providing a pressure sensor device, comprising a semiconductor pressure sensor, that is easy to mount and functionally reliable over time. Another aim of the invention is that of providing a pressure sensor device, comprising a semiconductor pressure sensor, whose assembly may be attained at least partially in an automated manner, without risks of damaging the most delicate components of the device itself, but guaranteeing the required mounting accuracy. Another aim of the present invention is that of providing a semiconductor pressure sensor particularly advantageous with the aim of attaining at least one of the previously outlined aims.

One or more of the aims of the invention are attained by a semiconductor pressure sensor, a corresponding pressure sensor device and a method for manufacturing a semiconductor pressure sensor having the characteristics indicated in the attached claims, which form an integral part of the technical teaching provided herein in relation to the invention.

BRIEF DESCRIPTION OF THE DRAWINGS

Further objects, characteristics and advantages of the present invention shall be apparent from the detailed description that follows and from the attached drawings, strictly provided for exemplifying and non-limiting purposes, wherein:

FIGS. 1 and 2 are perspective schematic views of opposite faces of a pressure sensor of the monolithic type, as outlined previously;

FIG. 3 is a schematic perspective view of a printed circuit board provided with a semiconductor pressure sensor, as outlined previously;

FIGS. 4-6 are perspective schematic views of a semiconductor pressure sensor according to the invention, FIG. 5 being a partially exploded view and FIG. 4 being a slightly enlarged view with respect to FIGS. 5 and 6;

FIG. 7 is a schematic section, in larger scale, of the sensor of FIG. 4;

FIG. 8 is an enlarged detail of FIG. 7;

FIG. 9 is a perspective view of a sensor according to the invention, provided with respective contact/electrical connection elements;

FIGS. 10 and 11 are a perspective view and an elevational view of a pressure sensor device according to the invention;

FIG. 12 is a schematic section according to line XI-XI of FIG. 11;

FIGS. 15 and 16 are views in larger scale of some details of FIGS. 13 and 14, respectively;

FIG. 22 is an elevational schematic section of the pressure sensor employed in the device of FIG. 20, in enlarged scale;

FIG. 23 is an elevational schematic section of a further embodiment of a semiconductor pressure sensor according to the invention.

DETAILED DESCRIPTION OF PREFERRED EMBODIMENTS OF THE INVENTION

Figure 13:
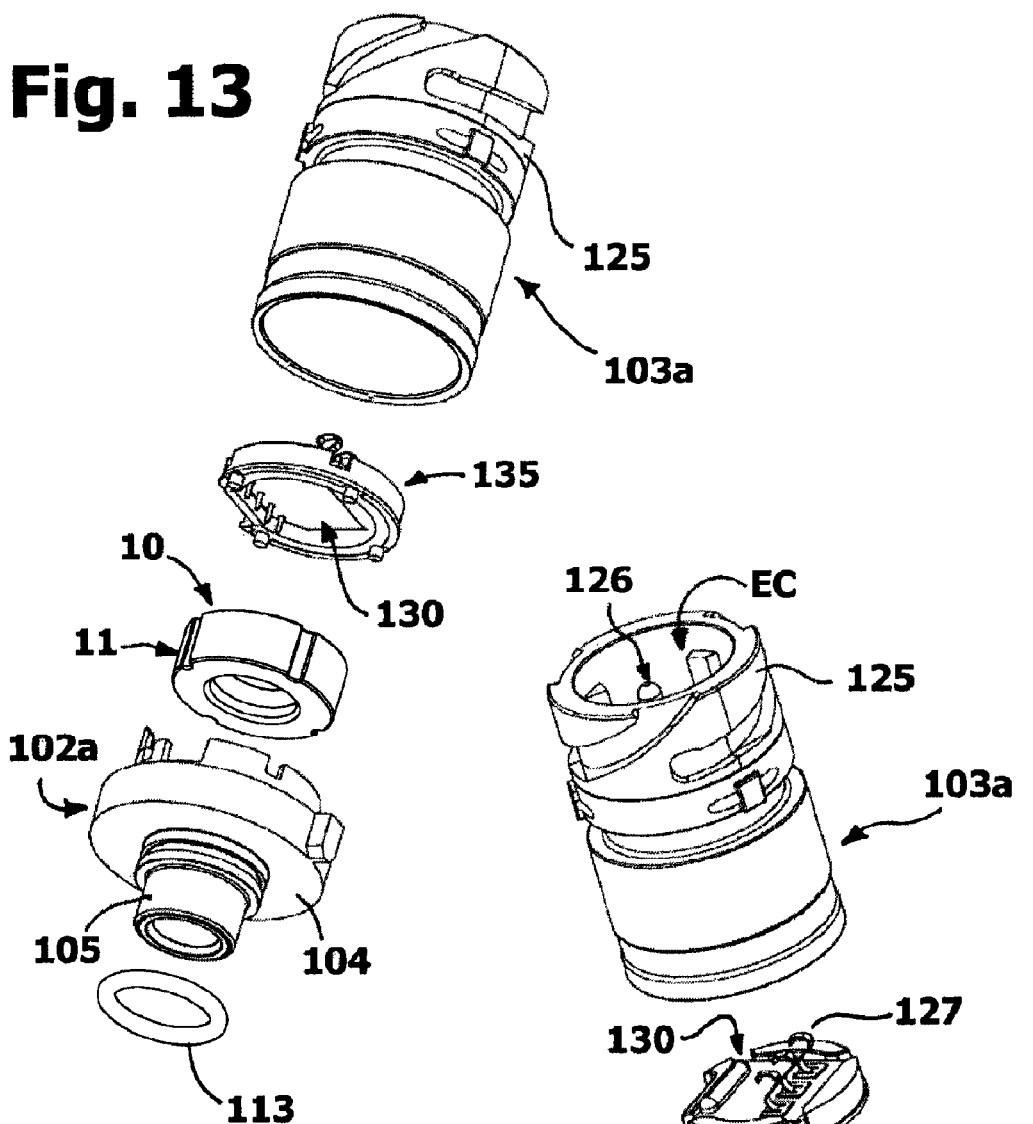
FIGS. 13 and 14 are partially exploded views, and from different angles, of the device of FIG. 10.
Figure 14:
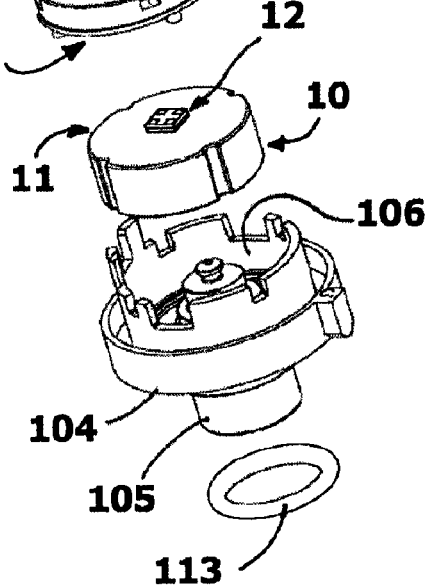

In its essence, the idea on which the present invention is based is that of providing a semiconductor pressure sensor including a "dedicated" support aimed at facilitating the mounting and manipulation of the sensor itself, particularly with the aim of manufacturing a pressure sensor device. The abovementioned support forms an integral part of the sensor, representing a substrate for the respective detection part, which includes a die made of semiconductor material, provided with a miniaturised circuit, and possibly with its own package. The support is configured to provide, at the same time, mechanical and/or hydraulic interface functions with the aim of mounting and hydraulic connection of the sensor inside a detection device.

Furthermore, preferably, the abovementioned support serves as a substrate also for electric contact elements of the pressure sensor, with the aim of connecting to a respective circuit arrangement or to an electric connector, thus also obtaining an electrical connection interface.

The abovementioned support has much greater overall dimension in the three-dimensions with respect to the detection part of the sensor, and a much greater thickness/height with respect to a typical printed circuit board or PCB, in particular of the type used in the pressure sensor devices field.

Due to the abovementioned support, the sensor according to the invention may be manipulated in an easy manner, even in automated manner if required. The support allows an easier arrangement of the semiconductor sensor inside a detection device. Furthermore, the sensor according to the invention, may also not be mounted on a traditional PCB, the support however representing a means alternative to the traditional printed circuit board for the mounting and positioning of a semiconductor sensor, with respect to the prior art.

Furthermore, if necessary, the support allows an automated mounting of the pressure sensor inside the casing of the pressure sensor device.

According to a further aspect, per se independently inventive, the support of the sensor according to the invention serves the functions of an adaptor. As a matter of fact, from a first point of view, the support may be configured depending on its final application, or depending on the configuration of the casing of a detection device on which the sensor itself is to be mounted, and this regardless of the embodiment of the detection part of the sensor, which remains unaltered or substantially unaltered. From a second point of view, the support may be configured to adapt, in terms of shape and/or dimensions, a pressure sensor of one first type to the shape and/or dimensions of a pressure sensor of a different type. Therefore, from this second point of view, the support of the sensor according to the invention represents an adaptor, which transforms the abovementioned pressure sensor of the first type to the shape and/or dimensions of the abovementioned pressure sensor of second type. In an advantageous embodiment, the support is substantially configured as the body of a pressure sensor of the type defined previously as "monolithic sensor". Through this particular embodiment, a semiconductor sensor according to the invention may be alternatively mounted on a casing of a sensor device conceived for mounting a monolithic sensor. This entails clear advantages for the manufacturer, in terms of product standardisation, given that semiconductor sensors or monolithic sensors may be used on a same device casing without distinction; furthermore, in this manner, a same assembly line may be used for manufacturing the two different types of pressure sensor devices.

In FIGS. 4-9, a semiconductor pressure sensor according to the present invention, which comprises a support part 11 and a detection part 12, is indicated in its entirety with 10.

The part 11, hereinafter also referred for as "adaptor support" for the sake of simplification, is substantially configured three-dimensionally as the body of a monolithic sensor, though having some substantial differences. The body of the adaptor support 11, preferably generally cylindrical-shaped, has an axial cavity, indicated with 13 in FIG. 7, open on a first end face of the body itself, such cavity having a bottom surface and a peripheral or circumferential surface; preferably, the cavity 13 has a circular section. The two faces of the support 11 are spaced from each other in an axial direction of the sensor 10, identifying the thickness, or the height of the support 11; the axis of the sensor 10, indicated with A in FIG. 7, represents in the illustrated example also a preferential mechanical mounting and/or hydraulic connection axis of the sensor, as observable hereinafter.

Indicated with 14 is a portion or wall of the body of the adaptor support 11 which is located at an end of the body itself, and in particular at the end opposite to the opening of the cavity 13, forming in the illustrated case a bottom of the cavity and a second face of the support body. Hereinafter, such wall 14 shall be referred to as "membrane portion" just for the sake of immediate comparison of the general geometry of the support body 11 with respect to the body of a monolithic sensor of the type described previously with reference to FIGS. 1 and 2.

As a matter of fact, in the currently described embodiment, the support 11 of the sensor 10 actually represents a body that transforms, in terms of shape and/or dimensions, a semiconductor sensor into a monolithic sensor, providing an adaptor interface for the mechanical and/or hydraulic and electrical connection of the sensor into a pressure detection device.

As particularly observable in FIGS. 5 and 6, a through hole, indicated with 15, having a smaller diameter with respect to the cavity 13, is formed in a central region of the membrane portion 14.

The adaptor support 11 is provided with means for facilitating the positioning and/or orientation of the sensor 10, as observable hereinafter; in the illustrated embodiment, these means comprise seats indicated with 16, defined in the external peripheral surface of the support 11 and having a recessed shape with substantially semicircular or circumferential arc sections, which is axially extended along the direction of height of the support 11. The presence of positioning means shall be deemed optional; also the shape and the arrangement of the seats 16 illustrated in the figures must thus be deemed merely for exemplification purposes, given that projections or positioning and/or orientation means of different conception may be provided for alternatively.

In the shown example, the adaptor support 11 has a monolithic body, i.e. configured in a single piece, made of any suitable material, such as for example ceramic material, thermoplastic material, thermosetting plastic material, a metal oxide (for example alumina), a metal, a semiconductor. Instead of being monolithic, the body of the support 11 may possibly be made up of several distinct parts, made integral to each other, such as for example a substantially cylindrical-sleeve-shaped part, in such a manner to define a cavity 13, associated at whose end is a closure wall, which forms the membrane portion 14; the various parts that form the body of the support 11 may be fixed to each other by means of welding or gluing, and they may also be made of material different from each other.

At least one portion of the support body 11 is preferably made with a stable material, at least from mechanical and/or thermal point of view, in view of the application, and specifically not subjected to dimensional deformations and/or variations when subjected to mechanical and/or thermal stresses. The abovementioned stable material is preferably employed at least for making the portion 14 on which the detection part 12 is fixed, in particular with the aim of avoiding mechanical tensions and/or damage when the sensor 10 is subjected to stresses. The type of stable material and the thickness of the portion 14 is selected, as mentioned, depending on the type of application of the sensor 10, for example depending on the type of fluid subjected to measurement, the order of magnitude of the pressures to be detected, the normal operating temperatures of the fluid, the environmental conditions. Stable materials useable can for example be selected from among those indicated previously (ceramics, thermoplastics, thermosetting material, metal oxides, metals, semiconductors). Alternatively, interposed between the detection part 12 and the adaptor support 11 may be an elastic material or adhesive, or a material adapted to compensate different dilatations or dimensional variations; or at least one portion of the support 11 may be made of material compatible with that of the detection part 12, for example material or materials having the same behaviour under stress.

The detection part 12 of the sensor according to the invention is made according to techniques usually employed for manufacturing semiconductor pressure sensors of the known type. The detection part 12 thus comprises a die made of semiconductor material, preferably silicon, indicated with 20 also in FIGS. 7 and 8. In the illustrated example, the die 20 is configured as a simple plate or small block made of silicon having a quadrangular section, but such solution shall not be deemed restrictive, given that the die may be of shapes different from the one illustrated and be made up of a plurality of mutually joined silicon parts or layers.

As observable particularly in FIG. 8, the body of the die 20 is configured in such a manner to have a small central blind cavity, indicated with 21, defined at whose end is a membrane, indicated with 22. The formation of the cavity 21, and hence of the membrane 22, is obtainable through any per se known technique, for example by etching the silicon wafer from which the die 20 is obtained. In an embodiment alternative to the exemplified one, the die 20 may consist in a plate or flat small block, i.e. without the cavity 21, that is made integral with a respective substrate provided with a cavity or an axial passage serving as a cavity 21.

Directly formed on the die 20, and specifically on the opposite face with respect to the support 11, is a miniaturised circuit, not shown in the figures, for detecting flexures/deformations of the membrane 21, according to the art per se known in the field of making integrated circuits on a semiconductor. The circuit formed in the die 20 may also comprise, alongside the actual detection element (for example a bridge of resistors or piezo-resistors), elements for amplifying and/or treating and/or conditioning the signal generated by said detection element.

In the illustrated non-limiting example, the die 20 does not have an actual package and directly fixed on the die 20 are contacts 23, in form of thin films made of electrically conductive material deposited on the die, preferably a noble material, such as for example gold. Obviously, in the practical embodiment of the invention, the die 20 may be enclosed in a respective package, projecting from which are the respective contacts, also differently shaped with respect to the illustrations provided in the figures, all according to art per se known techniques in the field of manufacturing traditional semiconductor pressure sensors.

In the case represented in the figures, the detection part 12 further comprises a substrate for the die 20, for example made of a glass or ceramic plate, having a cross-section similar to that of the die: this substrate, indicated with 25, is thus interposed between the die 20 and the body of the support 11. The die 20 is fixed on the substrate 25, for example by gluing, and the substrate 25 is in turn fixed, for example by gluing, to the support 11, on the surface of the membrane portion 14 outside the cavity 13. The presence of the substrate 25 shall be deemed optional, in that the substrate itself may be omitted, for example when the support 11 is made of ceramic material; in this case, the die 20 is fixed, for example glued, on the surface of the membrane portion 14 outside the cavity 13, in such a position that the cavity 21 of the die 20 and/or the respective membrane 22 faces the through hole 15 of the support 11, which represents a detection passage. The dimensions and sturdiness characteristics of the support according to the invention are clearly greater with respect to those of the thin glass layer that is at times provided for as a sub-layer for mounting a traditional semiconductor sensor on a printed circuit board or PCB.

From FIGS. 7 and 8 it is observable that the substrate 25, if present, is passed through by a respective axial cavity, indicated with 26 in FIG. 8. Preferably the substrate 25 is fixed on the support 11 in such a position that the cavity 26 is axially aligned, preferably in a coaxial manner, to the hole 15 of the membrane portion 14 of the support 11, and the die 20 is fixed on the substrate 25 in such a manner that the cavity 21 is axially aligned, preferably in a coaxial manner, to the cavity 26 of the substrate 25.

It should be pointed out that, though the wall 14 of the support body 11 is herein referred to as "membrane portion", it should not necessarily have a low thickness, similar or comparable to that of the membrane portions of the classic monolithic sensors, in order to be able to flex under the operative pressure of a fluid. In the case of the present invention, the thickness of the portion 14 which axially closes the cavity 13 of the adaptor support 11 may thus be definitely greater with respect to the membrane portion of the bodies of the known monolithic sensors, and thus even be non-deformable under the nominal or usual operation pressures of the sensor 10: as a matter of fact, in the sensor according to the invention, it is essentially the membrane 22 of the die 20 that should be able to be deformed under the action of the pressure of a fluid, with the aim of the respective detection or measurement. Furthermore, in embodiments alternative to that represented in FIGS. 4-8, the cavity 13 may be omitted or have a minimum height (for reference see the embodiments of FIGS. 22 and 23), with the body of the support 11 being entirely passed through by a hole.

For clearer representation, in FIGS. 4-8, just like in FIGS. 10-16, the sensor 10 according to the invention is illustrated without electrical connection or contact means, except for the contacts 23 of the die 20. The sensor 10 may be possibly connected to a connector circuit or a terminal arrangement of a pressure detection device, for example exploiting the contacts 23 and possibly employing for the purpose thin wires made of conductive metal material, for example gold.

Furthermore, in an embodiment of the invention associated to the three-dimensional body of the adaptor support 11 are specific electric contact means, so as to facilitate a sturdy and safe connection of the die 20 to the abovementioned circuit or terminal arrangement of a connector. A possible form of these contact means is illustrated in FIG. 9. Provided for on the face of the adaptor support 11 bearing the detection part 12 are connection contacts or tracks, made of electrically conductive material, for example copper, noble metals or metal alloys. These tracks, indicated with 28, have respective first ends 28a that substantially end at sides of the detection part 12, and specifically of the substrate 25 (if present, like in the represented case). The connection of the first ends 28a of the tracks 28 to the contacts 23 of the die 20 is preferably obtained through flexible contact elements, for example made of thin wires 29 made of electrically conductive material, preferably but not necessarily made of a noble metal, such as gold, welded or connected between the parts 23, 28 in question, according to per se known techniques (for example using processes of the known type such as "bonding", preferably adding a protection insulating material, such as resin poured over the die and the bonding region).

In the illustrated example, the second ends of the tracks 28, indicated with 28b, are substantially configured as pads, and form the physical interface for the actual electrical connection of the sensor 10 with the abovementioned circuit arrangement or the connector of a pressure sensor device. Obviously, the layout of the tracks 28 and the shape of the respective ends 28b may be different from the one illustrated, depending on the needs; for example, the pad ends 28b may have a central through hole, coaxial to a respective blind hole made in the face of the support 11: in such solution, fitted or fixed in the mentioned holes of the support 11 are first ends of the terminals that axially rise from the body 11 (for example of the type similar to those indicated with 5a in FIG. 1), in such a manner to be at contact—also through possible welding—with the perforated pads 28b of the tracks 28. In a solution, the abovementioned holes are configured as through holes and with a metallised surface, in order to bear the electrical connections on the face of the support 11 opposite to that on which the detection part 12 is provided for; thus in this case, conductive tracks may also be provided for on said opposite face of the support 11.

As observable in FIG. 9, the plan overall dimensions of the support 11 are much greater with respect to those of the detection part 12 or of the die 20.

The conductive tracks 28 are obtainable through any per se known technique. For example, the tracks 28 may be deposited through lithographic or photolithographic techniques, or by spraying metal material (metal spraying), all according to techniques known per se in the field of manufacturing printed circuit boards. Another possibility is that of providing tracks 28 by blanking a metal strip more or less thin, for example made of copper, then gluing them onto the surface in question of the support 11. In an embodiment of the invention the body of the support 11 (or at least the wall 14) is made of synthetic or plastic material: even in such embodiment the contact means 28 borne by the support 11 may be formed by applying an electrically conductive material on the support 11, for example through lithographic or photolithographic techniques, through metal spraying or using other known surface metallisation methods, for example plating. Still in the case of the support body 11 made of plastic material, for example thermoplastic or thermosetting material, the conductive tracks 28 may be obtained through blanking from a conductive metal strip and co-moulded to the support body 11, or plastic material intended to form the body of the support 11 is overmoulded to the tracks obtained from blanking. Also in the case of the support 11 made of plastic material, the tracks 28 may be obtained by blanking a thin flexible metal sheet and fixed to the support 11 by gluing, or by thermal adhesion, or even fixed in position through local re-melting of part of the material of the body 11.

Generally, in the embodiments wherein the body of the support 11 is made of plastic or synthetic material, the conductive tracks 28 may be obtained through MID (Moulded Interconnect Device) technologies.

A MID technology useable for such purpose is that of plating known as "two-shot moulding". In such case, for example, the body of the support 11 is formed initially through moulding of a first plateable plastic material. The body thus obtained is then selectively overmoulded with a second non-plateable plastic material, at the face of the membrane portion 14 outside the cavity 13, in such a manner to leave some regions of the first plateable material exposed, such exposed regions having a profile corresponding to that of the tracks or contacts 28 to be obtained; the tracks 28 are then actually formed through plating, right at the abovementioned exposed regions, using suitable conductive metal material, for example copper.

Another useable MID technology is the one referred to as "hot stamping". In this case thin metal strips intended to form the tracks or contacts 28—for example obtained by blanking from a strip—are arranged in a heated mould, into which the material intended to form the body of the support is then introduced; obviously the arrangement of the abovementioned sheets or strips into the mould is such that, after the moulding of the plastic material, respective connection portions of the tracks 28 remain exposed with respect to the body of the adaptor support 11.

Another MID technology useable for forming the body of the adaptor support 11 integrating the respective conductive tracks is that referred to as LDS (Laser Direct Structuring), developed by LPKF Laser & Electronics AG. Through this technology, a laser is used for drawing the shape of the tracks 28 on the surface of the support 11, whose body had been previously moulded using polymer material containing an additive sensitive to the laser, in particular formed by a metal complex. When the additivated polymer is exposed to the laser beam, the metal complex is broken into its elemental metals, for example copper or palladium, and into residue organic groups. The laser beam draws in such manner the layout of the tracks or contacts 28 of the face in question of the support 11, creating a rough surface containing embedded metal particles: these metal particles operate subsequently as nucleus for crystal growth, during the subsequent plating, carried out for example using copper. Application of the LDS technology under the present invention thus implies three main steps: injection moulding of the support body 11, laser structuring of the support 11, so as to define the layout of the tracks 28 therein, and subsequent plating, for the actual formation of the tracks 28.

According to the description beforehand it is observable how the support part 11 of the sensor 10 substantially serves, alongside substrate functions for the detection part 12 and for possible electrical connection means 28, also as mechanical/hydraulic connection member or interface and as an adaptor element.

As outlined previously, in the provided example the general configuration of the support body 11 is essentially similar to that of the body of a monolithic sensor: this means that the semiconductor sensor according to the invention may be mounted where a monolithic sensor is usually mounted. Thus, due to this characteristic, the sensor 10 according to the invention may be mounted on a casing of a pressure sensor device configured for mounting a monolithic sensor, obtaining the previously outlined advantages.

In order to clarify this concept, FIGS. 10-16 illustrate a pressure sensor device according to the present invention, integrating a semiconductor pressure sensor of the type described previously with reference to FIGS. 4-9.

As a non-limiting example let us suppose that the sensor device of FIGS. 10-16 is intended for use in a household heating and sanitary system. The device described hereinafter is however suitable for use also in other fields, such as domestic appliances, heating or air conditioning, as well as in the hydro-sanitary or heating field, or water systems in buildings or residential houses, with the aim of detecting the fluid pressure (liquids or aeriform) used in such fields, such as for example water or mixtures of water with other substances (for example water mixed with glycol or any other substance adapted to prevent the liquid in a system or circuit from freezing). The devices according to the invention can also be used in vehicles, such as internal combustion engine vehicles, for example in combination with a system for controlling emissions of nitrogen oxides ($NO_x$), or in combination with a fuel supply or injection system for a vehicle or with a lubrication system; in the first case, the fluid subject to pressure measurement may be for example ammonia in aqueous solution or urea while in the second case the fluid may be a fuel, such as gas oil, or a lubricating oil, such as engine oil.

With reference to FIGS. 10-12, the pressure sensor device is indicated in its entirety with 101, and identified in whose structure are two main parts, indicated with 102 and 103: part 102 essentially serves the functions of positioning/supporting and hydraulic connection, while part 103 essentially serves the functions of cover and electrical connection. The bodies 102 and 103 are mutually coupled, preferably but not necessarily in a sealing manner, to obtain a casing for internal components of the device 1. The bodies 102a and 103 may be obtained from moulding using relatively rigid material, such as for example thermoplastic material.

The body 102a has a support portion 104 and a connection portion 105. As observable particularly in FIGS. 12 and 16, the portion 104 includes an internal wall 104a that delimits a cavity or chamber 106 open at the opposite end with respect to the connection portion 105. Rising from the bottom of the chamber 106—in central position—is a tubular part 107, formed externally thereon being a step or a seat 107a for positioning radial seal means, such as an o-ring gasket, observable only in FIG. 12, indicated with 108. Furthermore, the portion 104 of the body 2a has an external or peripheral wall 109, that surrounds the wall 104a and defines a perimeter seat therewith, indicated with 112 in FIG. 16. The portion 105 of the body 102a is essentially configured as a hydraulic connection, mounted on which is a seal means, represented for example by an o-ring 113. The portion 105, which forms an inlet or pressure port of the device 101, is intended to be connected to a hydraulic circuit, not represented, containing the fluid to be subjected to pressure and temperature detection. In the illustrated example the portion 105 is passed through in axial direction by a conduit, indicated with 114 in FIG. 12, whose upper section passes through in the tubular part 107 which rises from the bottom of the chamber 106, forming an inlet passage of the device 101.

Accommodated in the chamber 106 is a semiconductor pressure sensor according to the invention, or of the type previously indicated with 10 (as mentioned previously, in FIGS. 10-16 the contact elements of the sensor 10, or the conductive tracks 28 of FIG. 9 and the respective connection wires, 29 were not represented). As observable in FIG. 12, in the assembled condition of the device 101, the outlet of the conduit 114 faces the cavity of the adaptor support 11 of the pressure sensor 10, the tubular part 107 being inserted into the cavity 13 of FIG. 5; the gasket 108 provides a radial seal between the external surface of the part 107 and the peripheral surface of the cavity of the support 11 of the sensor 10.

The body 103a of the electrical connection part has a hollow portion or cavity 120, delimited by a bottom wall 121 and a peripheral wall 122, the edge of the latter being configured to be coupled into the seat 112 (FIG. 16). The device 101 has a connector, indicated in its entirety with EC, including a tubular part 125 of the body 103a, at least partially extended into which are terminals for the electrical connection of the device 101, one of which is indicated with 126. The terminals 126 are substantially L-shaped: a first portion of the terminals, indicated with 126a in FIG. 12, substantially rectilinear, is extended into the tubular part 125, to form the connector EC therewith. The second portion of the terminals, indicated with 126b, substantially orthogonal to the first portion 126a, faces the inner part of the cavity 120, so as to provide an abutment for flexible contact elements 127, made of electrically conductive material.

Indicated with 130 in FIGS. 12-16 is an electronic circuit or printed circuit board. The circuit 130 comprises a circuit support or board, indicated with 131 in FIGS. 15 and 16, made of electrically insulating material and provided with electrically conductive tracks, not represented. The board 131 may not be provided with electronic components, in which case the circuit 130 only performs electrical connection functions, through the respective conductive tracks, between the sensor 10 and the terminals 126 of the connector EC. Connected to some conductive tracks of the terminal board 131 is the base part of a respective contact element 127 (see for example FIG. 16). Some conductive tracks of the terminal board 131, for example to which the same elements 127 are connected, end with pads formed at holes made as through holes in the terminal board; provided at such holes are second contact elements, indicated with 132 in FIGS. 13 and 16, projecting from the face of the terminal board 131 opposite from that on which the elements 127 are provided for. The upper ends of the elements 132 are preferably protected and insulated by means of a protection material 133, for example a synthetic resin small block.

In FIGS. 12-16 indicated in its entirety with 135 is a positioning and/or support member, preferably made of plastic material, preferably thermoplastic, or metal material. With particular reference to FIG. 16, the member 135, hereinafter referred to as "spacer" for the sake of simplification, has appendages or pins, indicated with 136, intended to be coupled with the perimeter seats 16 of the adaptor support 11 of the sensor 10, with the aim of obtaining a polarisation, i.e. an accurate mutual coupling between the parts in question. In the example, the pins 136 have a substantially circular section, but their shape may obviously be different from the one represented, however preferably a shape at least partially complementary to that of the seats 16 of the support 11 of the sensor 10. Preferably, the wall 104a of the body 102a also has seats—indicated with 104c in FIGS. 15 and 16—for accommodating at least one portion of pins 136. The spacer 135 has a central passage 138, having a section preferably smaller with respect to the area of the face of the support 11 on which the detection part 12 is located. The spacer 135 also defines a seat 139, preferably recessed, for positioning and/or accommodating—at least partially—the terminal board 131 of the circuit 130.

In the assembled condition, the flexible contact elements 127 are on the circuit 130 on the opposite side with respect to the spacer 135 and the contact elements 132 are at contact with the pads 28b of the tracks 28 (see FIG. 9) of the sensor 10. The upper ends of the flexible contact elements 127 are at contact with the end portion 126b of the terminals 126 (FIG. 12), in a condition of electric contact through at least partial elastic compression of the elements 127. In an advantageous embodiment, also the contact elements 132 are of elastic type, for example substantially configured in form of axially extended helical springs, preferably having at least one turn having a larger diameter at the lower end, flattened by grinding the end turn: in such case, in the assembled condition of the parts, as in FIG. 12, the lower end of the spring elements 132 elastically presses against the pads 28b of the tracks 28 (FIG. 9). Obviously, the elements 132 may be replaced by elements similar to those indicated with 127, or by any other type of connection member suitable for the purpose, including welded metal wires. From FIG. 12 it is also observable how the height of the spacer 135 (i.e. its thickness in axial direction) and the presence of the passage 138 ensure that the detection part 12 of the sensor 10 is accommodated and protected right inside the body of the spacer 135, at the lower part of the circuit 130.

The body 103a preferably has, inside the chamber 120, one or more axial projections (not represented) for peripherally pressing the spacer 135 against the body 102a, thus maintaining it in position. Alternatively, the spacer 135 may be fixed (for example by means of screws) or welded to the body 102a.

Under normal conditions of use, the device 1 is hydraulically connected to a line of the fluid subjected to control, through the connection portion 105 fitted, for example, into a pipe of the fluid in question. The pressure of the fluid may exert pressure on the membrane 22 (FIG. 8) of the detection part 12 of the sensor 10, due to the presence of the detection passage represented by the hole 15 (FIGS. 5-6 and 8); in this manner a flexure of the abovementioned membrane 22 is caused, the degree of such flexure being detected through the circuit means integrated in the silicon die of the sensor: a signal representing the pressure value of the fluid is generated to the contacts 23 (FIG. 9) of the detection part 12. It should be observed that, under normal operation, the pressure of the fluid tends to push the adaptor support 11 of the sensor 10 in the direction opposite to the pressure inlet: though the support 11 is not rigidly connected to the casing, it cannot move in the abovementioned direction, due to the presence of suitable means, such as the spacer 135, which as mentioned is mounted between the bodies 102a-103a in fixed position. The signals representing the pressure, possibly amplified and/or treated and/or processed in a per se known manner by electronic components integrated in the die and/or provided for on the circuit 130, reach the terminals 126 of the device 1, which are electrically coupled to an external wiring—not represented—connected to a suitable external control unit.

In this embodiment, the circuit 130 is extended above (with reference to the figures) the sensor 10, at a given distance therefrom (for example at least 2-4 mm), i.e. without direct contact between the terminal board 131 and the sensor 10, the two components being connected through contact elements 132: possible stresses exerted on a component are thus not substantially transferred to the other component. For this purpose, in the preferred embodiment, the spacer 135 is operatively interposed between the circuit 130 and the sensor 10, advantageously serving as a separator element, as well as for accommodation and/or positioning purposes between the parts in question.

In the illustrated example the sensor 10 is not rigidly coupled or fixed to the casing or to other internal parts of the device 101, and this characteristic contributes to reduce measurement errors, increasing the measurement accuracy and stability over time and/or avoiding risks of damage due to mechanical strains or stresses. Furthermore, as observed, according to a further preferential characteristic, also the circuit 130 is not rigidly coupled or fixed to the casing 102a-103a of the device. In the embodiment described, the sensor 10 is elastically associated to the abovementioned casing through the seal means represented by the gasket 108 of FIG. 12, interposed between the body of the support 11 of the sensor 10 and the body 102a; on the opposite side, the spacer 135 is provided for between the support 11 of the sensor 10 and the part 103a. The circuit 130 is instead borne on the spacer 135, i.e. it is associated to a distinct component with respect to the casing or structure 102a-103a. Furthermore, the circuit 130, may not be mechanically fixed to the spacer 135: in such embodiment, the circuit 130 is mounted elastically with respect to the casing 102a-103a through the flexible contacts 127, interposed between the circuit itself and the body 103a (in particular between the circuit and the terminals 126 integrated in the body 103a); on the opposite side, the spacer 135 is provided for—in fixed position—between the circuit 130 and the body 102a. The presence of the gasket 108 allows insulating the sensor 10 from the casing, and in such manner, any mechanical stresses applied on the casing are not transmitted to the sensor; also the preferred presence of the spacer 135 and/or of the flexible contact elements 127 and/or 132 contributes to make the assembly operations of the device 101 less critical, and thus simpler, and reduce or eliminate the risk that external strains or stresses operating on the body 102a and/or 103a be transmitted to the circuit 130; for such purpose, the presence of a slight mounting clearance or tolerance between the terminal board of the circuit 130 and the respective seat 139 defined in the spacer 135 is advantageous.

As already outlined previously, due to the presence of the support 11, the sensor 10 according to the invention may be manipulated and mounted on the casing of the device 101 in an easy and safe manner, also through automated equipment. The support 11 serves, as observed, also the functions of mechanical/hydraulic connection of the sensor 10, as well as support for the respective electric contact elements, allowing avoiding direct mechanical stresses on the detection part 12. The body of the support 11 further serves as an adaptor, allowing mounting into the device 101 of a semiconductor sensor according to the invention in place of a monolithic sensor, and vice versa: the device 101 may thus be equipped with a pressure sensor 10 according to the invention or with a monolithic pressure sensor of the type described previously with reference to FIGS. 1 and 2 without distinction.

As observable, the adaptor support according to the invention does not serve, per se, the functions of a printed circuit board or a substrate for mounting the sensor on a traditional printed circuit board or PCB for pressure sensor devices, but on the contrary it represents an alternative means for mounting and connecting the sensor into a pressure sensor device.

While a PCB is essentially a two-dimensional component and is relatively fragile, thus entailing given manipulation and mounting restrictions, the support 11 is actually a three-dimensional component, having a sturdy structure, which can be manipulated and mounted into a sensor device in a simpler and safer manner. From the illustrated example, it can for example be observed how the thickness (or the height in axial direction) of the support 11 is definitely greater with respect to the thickness of a classic PCB, like the one indicated with 130-131.

Generally, the three-dimensions of the support 11 (i.e. height/thickness, width and depth or diameter) are all greater with respect to the thickness of a normal PCB for pressure sensor devices; indicatively, the thickness/height of the support 11 is at least twice, preferably at least three times, more preferably at least four times with respect to the thickness of a standard PCB for pressure sensor devices.

In a possible variant of the sensor device 101 the circuit 130 may be omitted and the terminals 126 directly connected to the pads 28b of the tracks 28 of FIG. 9; for example, with reference to FIG. 12, the shape and position of the part 126b of the terminals 126 may be modified in such a manner to be directly at contact with the abovementioned pads 28b, with welding between the parts, or elastic contact elements of the type indicated above with con 127 may be provided for between the pads 28b and the part 126b of the terminals.

Figure 17:
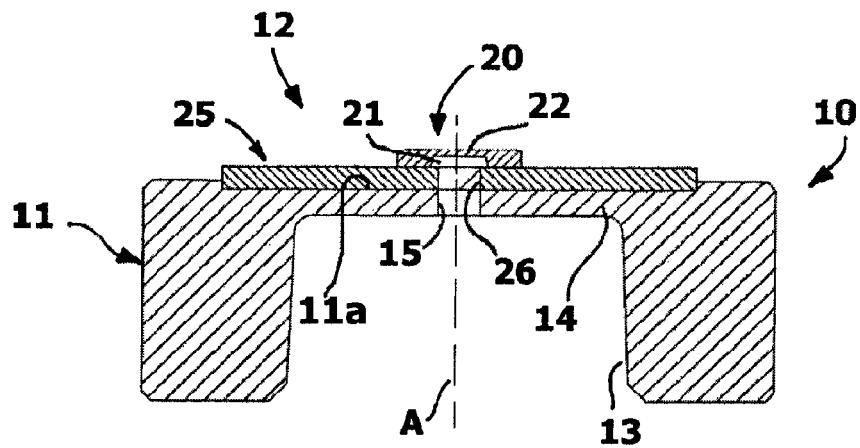
FIG. 17 is a schematic section of a pressure sensor according to a further embodiment of the invention.

Illustrated in FIG. 17 is the case of a sensor 10 according to the invention whose support 11 defines—at the upper part— an accommodation 11a, such as a recess or seat, for the positioning of a substrate 25 having plan overall dimensions definitely greater with respect to that of FIG. 8 (i.e. projecting laterally with respect to the die 20), without prejudice to the other characteristics described previously.

In a possible modified version, a substrate 25 like the one of FIG. 17, also in the absence of the accommodation 11a, is made up of a glass or fibreglass support, or made of any other suitable material, fixed on which are the electric contact elements of the sensor, for example having a general configuration similar to that of the tracks 28 of FIG. 9, and possibly other electric or electronic components. The exemplified solution of FIG. 17 first allows obtaining the substrate 25, substantially configured as a printed circuit board, and subsequently mounting the sensitive element or die 20 thereon; such substrate 25 with the die 20 is then mounted on the support 11, for example by gluing, to obtain the sensor 10. The solution of FIG. 17 allows an easier and safer mounting of the die 20 on a circuit 25, for example through automated production systems, such as systems of the type commonly used in the electronic industry.

Figure 18:
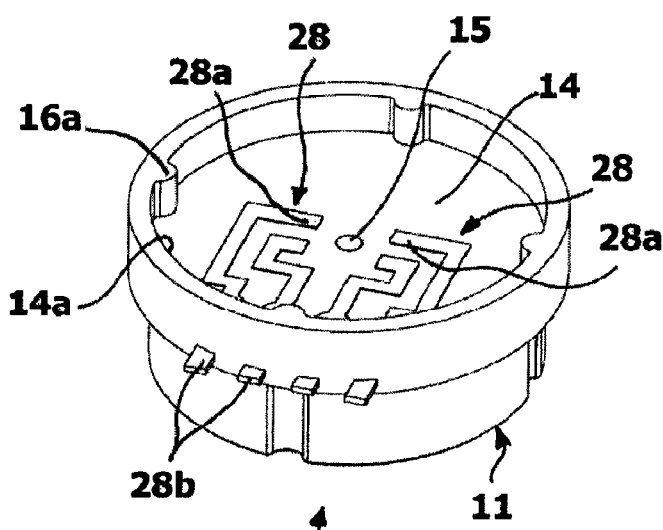
FIGS. 18 and 19 are perspective views of respective further embodiments of a semiconductor pressure sensor according to the invention.

Illustrated in FIG. 18 is a variant wherein the support 11 of the sensor 10 is made of thermoplastic material, particularly material with high Tg (glass transition temperature) or of thermosetting material. In this figure, just like in the successive FIG. 19 the detection part 12 of the sensor 10 with the respective contact elements is not shown, but such elements can however be analogous to those indicated with 23 and 29 in FIG. 9.

In the solution of FIG. 18 the tracks 28, preferably having a low thickness, for example about 0.3 mm, are co-moulded inside the material forming the body of the adaptor support 11. The tracks 28 partially emerge on the surface of the support 11 and partially submerge into the material the support is made of. In this case, the tracks 28 have ends 28a projecting laterally from the support body 11, useable for the connection of the sensor 10 to a circuit arrangement or to terminals, not represented, through any per se known method or means: this solution facilitates co-moulding or overmoulding. The moulding or co-moulding or overmoulding operations preferably provide for the use of at least one mould, at least partially accommodated in which are the tracks 28 and injected in which is the material intended to form the support 11.

The material of the tracks 28 may be a metal-clad, formed by a lower layer made of copper and an upper layer dedicated to wire-bonding (i.e. the connecting of wires like the ones indicated with 29 in FIG. 9) using silicon-aluminium or gold-aluminium.

Figure 19:
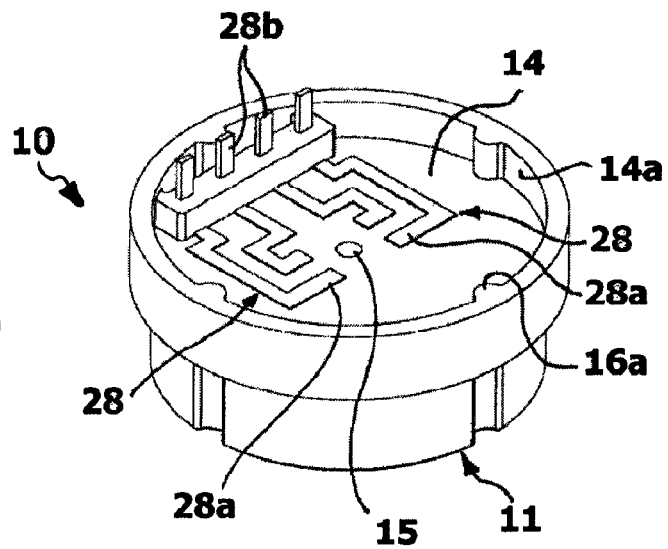

FIG. 19 illustrates a further variant, based on the use of materials and processes analogous to the ones mentioned with reference to the variant of FIG. 18. Also in this solution the tracks 28 are co-moulded, in such a manner to be partially emerged on the surface of the support 11; contrary to the previous case, the end section of the tracks 28 is folded upwards, with a portion however submerged in the material forming the support 11: in this solution, the "vertical" ends 28b of the tracks 28 form terminals useable for connection towards a printed circuit board or PCB, which might be arranged over the sensor 10.

In the embodiments of FIGS. 18 and 19 the upper part of the support 11 is configured in a different manner with respect to the embodiments described previously, in such a manner to define also an annular edge or wall 14a, that circumscribes the positioning region of the detection part of the sensor (or the part previously indicated with 12, including the die 20) and the main portion of the tracks 28. The support 11 of FIGS. 18 and 19 may for example be used alongside a spacer different from the one indicated with 135 in FIGS. 10-16, provided with means, for example in form of semicircular peripheral seats, suitable to be coupled with the projections indicated with 16a, defined in the internal part of the wall 14a.

In the embodiments of FIGS. 18 and 19 the wall 14a defines, alongside the wall 14, a chamber or blind cavity, advantageously deposited or poured in which may be a protection material, not represented, adapted to cover the detection part; this protection material, for example gel, is of the type resistant against chemical attack (for example a fluoride silica gel), but still allowing the deformation/flexure of the membrane 22 of the die 20 (FIG. 8).

Figure 20:
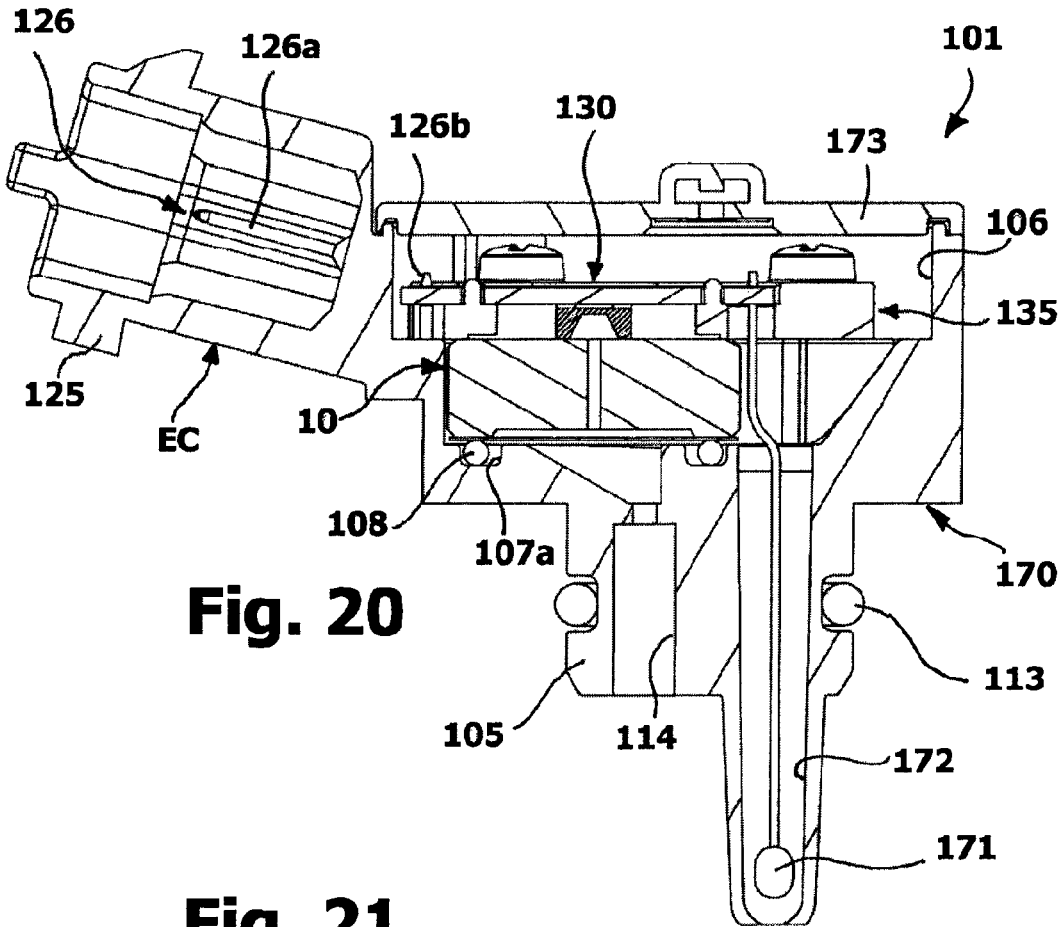
FIG. 20 is an elevational schematic section of a pressure sensor device according to the invention, employing a pressure sensor according to a further embodiment of the invention.
Figure 21:
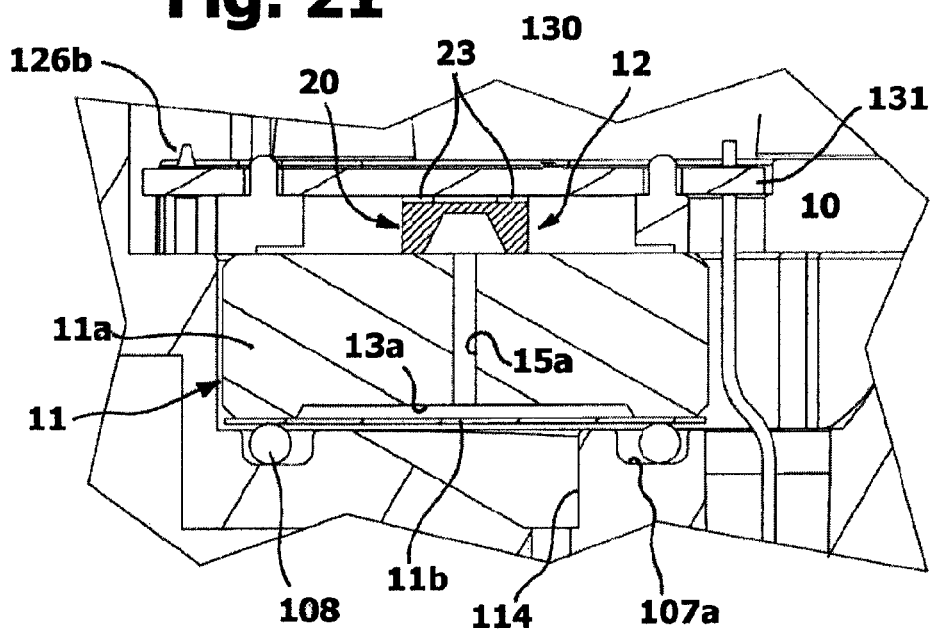
FIG. 21 is an enlarged detail of the device of FIG. 20.

Schematically illustrated in FIGS. 20 and 21 is another example of a pressure sensor device, suitable to be mounted on which is a semiconductor pressure sensor made according to a further embodiment of the invention, said sensor being illustrated in FIG. 22 through a schematic section, alongside a respective printed circuit board. In FIGS. 20-22 the same reference numbers of the previous figures are used, to indicate elements technically equivalent to the ones described.

The sensor device 101 of FIGS. 20 and 21 has a generally different configuration with respect to the device of FIGS. 10-16, though comprising the essential elements of the latter. In this case, the device 101 has a main body 170 that substantially serves the functions of the bodies previously indicated with 102a and 103a. Defined in the body 170 is a main cavity, indicated with 106, for the accommodation of the pressure sensor 10, the spacer 135 and the circuit 130, directly opening on the bottom of such chamber 106 being the conduit 114, in absence of the tubular part 107 of FIGS. 12-16. In this case the device 101 also includes a temperature sensor 171, connected to the circuit 130, and which is extended to a respective channeling 172 formed in the part of the connection 105. The terminals 126 are generally flat-shaped and are configured in such a manner to have a connection end 126b having a small section, and preferably generally sharp-pointed, an intermediate portion with multiple folds, not shown, and a straight end portion 126a, intended to be extended into the tubular portion 125, to obtain the connector EC therewith.

In this embodiment the adaptor support 11 of the semiconductor sensor is configured in several parts, particularly with the aim of allowing the use of the sensor to detect the pressure of aggressive fluids, for example from a chemical and/or thermal point of view.

In the embodiment of FIG. 22, the support 11 has a main body part 11a, which is three-dimensional, defined in which is a cavity 13a, having a larger diameter and lower depth with respect to the previous embodiments: in practice, the portion indicated with 14 is definitely thicker with respect to the portion 14 of the previous embodiments and almost entirely forms the body part 11a; the portion 14 in this embodiment is passed through by a respective through hole 15a, having an end that leads into the cavity 13a; also the hole 15a is clearly longer with respect to the hole 15 of the previous embodiments.

The cavity 13a of the body part 11a is closed at the lower part by another part of the body of the adaptor support 11. In particular, indicated with 11b is a substantially two-dimensional body part, configured as a thin membrane, added—at the lower part—to the body part 11a, in such a manner to sealingly close the cavity 13a; the membrane part 11a is for example glued to the region of the lower face of the part 11a that surrounds the opening of the cavity 13a. The detection part 12 of the sensor, here without the substrate 25, is mounted on the body part 11a opposite the cavity 13, substantially at the respective end of the hole 15a. In such configuration, a flexure and/or deformation of the membrane 11b, due to the pressure of the fluid subject to control, determines a pressure variation in the chamber formed by the cavity 13a, the hole 15a and the hole 21 of the die 20 (see FIG. 22), which is thus transmitted to the membrane 22 of the die, for detection purposes. The contacts 23 are provided for on the upper face of the die 20.

In a preferential version, the chamber formed by the cavity 13a, the hole 15a and the cavity 21 of the die 20 is filled in a known manner with an uncompressible fluid, such as a liquid not aggressive against the die 20, susceptible to transmit the deformations of the membrane part 11b of the support 11 to the membrane 22 of the die. It is observable that the membrane part 11b has a deformable region having an area definitely greater with respect to the membrane 22 of the die 20, and this allows "amplifying" the deformation effect of the membrane 11a, due to the pressure of the fluid subjected to detection, towards the membrane 22.

Furthermore, in the case exemplified in FIGS. 20-22, a circuit 130 including a circuit support or board 131 is connected in a direct manner to the detection part 12 or to the die 20. In the example, the lower surface of the support 131 is provided with conductive tracks, not shown, on which the contacts 23 of the die 20 adhere: the abovementioned tracks and the contacts 23 may be made integral with each other, for example through conductive adhesives or bonding techniques or welding, or the electric contact may be obtained through simple resting, in such case at least one of the terminal board 131 and the group 11 and 12 is elastically pressed against the other.

Also in the case of FIGS. 20 and 21 the sensor 10, or its adaptor support 11, is mounted in a position facing the conduit 114 without being rigidly coupled to the casing or structure of the device 101, or it is mounted in an elastic manner with respect thereto, through the gasket 108. Given the different structure of the sensor 101 of FIG. 20, a different configuration of the gasket 108, operating axially or in plane on the adaptor support 11 herein, is provided for, and specifically on the membrane part 11b at the annular region that surrounds the cavity 13a, or in a region of the adaptor support 11 adapted to be compressed axially or in plane without determining deformations of the membrane 11b. In this case the conduit 114 has a substantially flared or conical end part, opened directly on the bottom of the chamber 106; the bottom of the chamber is substantially extended according to a respective general plane and the lower face of the support 11, represented by the membrane part 11b, is substantially parallel to the abovementioned general plane, with the conduit 114 opening on the membrane part, in a very close position thereto. The region in which the abovementioned end section of the conduit 114 opens on the bottom of the chamber 106 is circumscribed by a seat 107a, positioned in which is the plane or axial seal gasket 108, preferably but not necessarily coaxial or centred with respect to the axis of the pressure sensor 10.

In this embodiment the pressure/tension transducer unit, i.e. the pressure sensor 10, the circuit 130 (herein also provided with the temperature sensor 171), having the spacer 135 interposed, is inserted into the chamber 106 in such a manner that the temperature sensor 171 fits into the passage 172 and the membrane part 11b of the adaptor support 11 elastically abuts against the gasket 108. The abovementioned unit may be preassembled, if the die 20 and the terminal board 131 are mechanically joined to each other, or mounted in successive steps (first the sensor 10, then the spacer 135 and then the terminal board 131, or first the sensor and then the spacer already bearing the terminal board) in case of the electric contact simply resting between the die and the terminal board. The support 135 is then fixed in position inside the chamber 106, for example by means of screws 173 or similar threaded members. After the described positioning, the sharp pointed ends 126b of the terminals 126 are inserted into the respective connection holes of the terminal board 131, where they are subsequently welded. The chamber 106 may thus be closed by means of a cover, indicated with 174.

It shall be observed that, with the embodiment of FIG. 22, the semiconductor sensor according to the invention is advantageously useable for the detection of fluids being potentially aggressive against the die 20 from a chemical or thermal point of view, without however requiring—as is typical in the prior art—having to provide for complex seal systems inside the detection device, to insulate a semiconductor sensor or a printed circuit board on which said sensor is mounted against the fluid. As a matter of fact, in the case of the solution of FIG. 22, use of material resistant against attack of the fluid subject of detection for making the membrane part 11b is sufficient. It shall also be observed that the parts previously indicated with 11a and 11b may be possibly configured in a single piece, to form the support 11. Obviously also the device of FIGS. 9-16 overcomes the need of complex seal systems to insulate the printed circuit board from the fluid.

Schematically illustrated in FIG. 23 is a possible embodiment of a pressure sensor of the absolute type, according to the invention (the other embodiments regarding the so-called differential sensors). In this case a reference pressure chamber, indicated with 21a, is formed directly in the detection part 12. In the illustrated example, the die 20 is configured in form of a small silicon block; a cavity may be formed in the small silicon block and, in a protected environment at the desired reference pressure, possible openings of the cavity are watertight sealed, for example after having created the predefined reference pressure in the abovementioned cavity, so as to form the chamber 21a. Another possibility is that of forming a blind cavity in the small silicon block during the step of forming the die made of semiconductor material, in a protected environment at the desired reference pressure, where the cavity is sealed by the same material of the die, so as to form the chamber 21a. Still another possibility is that of forming the die 20, instead of it being in a single body, in two or more semiconductor parts sealingly joined together, so as to obtain the configuration of FIG. 23 with the chamber 21a at the reference pressure.

In this embodiment, the detection membrane 22 is at the lower part of the die 20, directly facing the detection hole 15, that entirely passes through the three-dimensional body of the adaptor support 11, here without cavities 13 or 13a, or portions 14 or 14a with variable thickness. Also in this embodiment the sensor 20 may be connected, at the upper part of the detection part 12, to a printed circuit board, as described with reference to the solution of FIG. 22; alternatively, provided for on the body of the adaptor support 11 may be conductive tracks of the type indicated previously with 28 (a solution applicable also in the solution of FIG. 22). Furthermore, also in the case of the embodiment of FIG. 23, in the practical use of the sensor 10, the through hole 15 of the support 11 may directly face or be in fluid communication with an inlet conduit of the fluid to be subjected to pressure detection; preferably provided for in this case, is a gasket 108 operating axially on the face of the support 11 opposite to the die 20, similarly to the case of FIG. 22.

It is clear that numerous variants are possible for the pressure sensor and the pressure sensor device described for exemplification purposes, without departing from the scopes of the invention as described in the claims that follow.

The technical solution idea of configuring an adaptor support for the detection part of a sensor shall not be deemed as restricted to the two types of sensors described previously, i.e. monolithic and semiconductor sensors. As a matter of fact, may also refer to other types of sensors, not necessarily pressure sensors, and generally in cases where a sensor of a first type, intended to detect a given magnitude, may be adapted or transformed, in particular adapted in terms of shape and/or dimensions, in a sensor of a second type, for measuring said magnitude; the idea is thus also applicable regarding a general sensor device, so as to allow mounting alternatively to the sensors of the two types.

The invention claimed is:

1. A semiconductor pressure sensor for a pressure sensor device, the sensor having a pressure detection element which comprises a membrane made of semiconductor material, particularly silicon, wherein the sensor includes a support having a three-dimensional body passed through by a detection passage, the detection element being made integral to a first end face of the three-dimensional body substantially at a respective end of the detection passage, the support being configured to serve the function of a mechanical and/or hydraulic adaptor or interface with the aim of mounting the sensor into a pressure sensor device, particularly to allow mounting the pressure sensor into a pressure sensor device configured for mounting a sensor of the type referred to as monolithic or ceramic.

2. The sensor according to claim 1, wherein the detection element comprises a silicon die, defining the membrane and obtained on which is an electric circuit provided with electrical terminals.

3. The sensor according to claim 1, further comprising first electrical connection means associated to the support, the support being configured to serve also the functions of an electrical adaptor or interface with the aim of mounting the sensor into a pressure sensor device.

4. The sensor according to claim 3, wherein the detection element comprises a silicon die, defining the membrane and obtained on which is an electric circuit provided with electrical terminals, the sensor further comprising second electrical connection means operatively interposed between the terminals of the die and the first connection means associated to the support body, the second connection means being preferably of the flexible type.

5. The sensor according to claim 2, wherein the die is directly made integral to the three-dimensional body or the detection element comprises at least one substrate interposed between the die and the three-dimensional body.

6. The sensor according to claim 5, wherein the substrate has a through opening which is substantially aligned to the detection passage and/or it has associated connection means for the electrical connection of the detection element to an external circuit.

7. The sensor according to claim 1, wherein
the three-dimensional body has a cavity, opening on a second end face of the three-dimensional body, and a body portion which defines a bottom of the cavity and the first end face of the three-dimensional body;
the body portion has a through opening which is extended between the cavity and the first end face of the three-dimensional body, the through opening having a passage section narrower with respect to a passage section of the cavity;
wherein the cavity and the through opening belong to the detection passage.

8. The sensor according to claim 7, wherein the support further comprises a membrane which closes the cavity at the second end face of the three-dimensional body.

9. The sensor according to claim 2, wherein
the die has a respective blind cavity, having a bottom defined by the membrane made of semiconductor material; or
a hermetic chamber is entirely defined inside the die, having a bottom wall defined by the membrane made of semiconductor material.

10. The sensor according to claim 3, wherein the first electrical connection means comprise terminals or conductive tracks or sheets which are at least partially deposited on the support, or fixed onto the support, or at least partially incorporated in the support.

11. The sensor according to claim 10, wherein the terminals or tracks or sheets are obtained from, or associated to the support, through a technology selected from among:
lithography or photolithography of conductive material on the support;
spraying of conductive material on the support;
gluing of conductive sheets onto the support;
deposit of conductive material onto the support;
surface metallisation of the support;
plating of the support;
co-moulding of conductive sheets to the support;
thermal adhesion of conductive sheets to the support;
fixing conductive sheets by local remelting of part of the material of the support;
MID technologies;
"two-shot moulding" plating; and
"Laser Direct Structuring".

12. The sensor according to claim 1, wherein:
the support is monolithic or it is made up of several body parts made integral to each other; and/or
the support is at least partially made of a material selected from among: ceramic materials, synthetic materials, thermoplastic materials, thermosetting materials, metal oxides, metal materials, semiconductors; and/or
the support is a generally cylindrical-shaped or has a substantially circular cross-section; and/or
the detection passage has at least one portion having a substantially circular cross-section; and/or
the support is provided with positioning and/or orientation means; and/or
the support defines a region for holding a protection material of the detection element, such as gel.

13. A pressure sensor device which comprises:
a casing defining a chamber and an inlet passage;
a pressure sensor accommodated in the casing,
a circuit arrangement to which the pressure sensor is electrically connected,
wherein the sensor is a semiconductor sensor according to claim 1.

14. The device according to claim 13, wherein the chamber of the casing has a bottom and wherein:
rising from the bottom of the chamber is a projecting or tubular part formed in which is an end section of the inlet passage, the projecting part being at least partially inserted into the cavity of the support of the sensor, between a surface of the cavity of the support of the sensor and a surface of the projecting part being in particular provided for a radial seal, and
the inlet passage is open on the bottom of the chamber, a lower face of the support of the sensor is substantially parallel to a general plane of the bottom of the chamber, in a close position to the bottom itself, between the lower face of the support of the sensor and the bottom of the chamber being in particularly provided for a seal of the axial type.

15. The device according to claim 13, wherein the circuit arrangement includes a circuit support at least partially accommodated in the chamber, the support of the sensor being preferably in a spaced position with respect to the circuit support inside the chamber.

16. The device according to claim 13, wherein accommodated in the chamber is a spacer body, configured as a separate component with respect to the sensor, the circuit support and the casing, the body spacer being at least partially interposed between the support of the sensor and the circuit support, the spacer body having preferably at least one from among: an axial cavity to which a face of the support of the sensor is faced and/or inside which the detection element of the sensor is positioned, a recess for receiving at least part of the circuit support, one or more elements for coupling to the support of the sensor, one or more elements for coupling to the casing.

17. The device according to claim 15, wherein accommodated inside the chamber is a body for positioning at least one of the circuit support and the sensor, the positioning body being configured as a distinct part with respect to the casing and comprising reference and/or positioning means for at least one of the sensor and the circuit support, where in particular the sensor is not rigidly associated to the casing, i.e. it is mounted elastically or in a moveable manner with respect to the casing inside the chamber, particularly through seal means.

18. The device according to claim 13, wherein the circuit arrangement comprises an electric connector (EC) including connection terminals each having a first portion which extends at least partially into the chamber and a second portion which extends outside the chamber, and wherein operatively interposed between the first portion of the terminals and the circuit support are flexible contact elements, the flexible contact elements being configured and arranged to be in a compressed condition between the first portion of the terminals and the circuit support.

19. A method for manufacturing a semiconductor pressure sensor, the method comprising the operations of:

i) providing for a pressure detection element having a membrane made of semiconductor material, particularly silicon,
ii) providing for a three-dimensional body passed through by a passage,
iii) making the detection element integral with the first end face of the three-dimensional body, substantially at a respective end of the passage, such that the three-dimensional body forms a support or a main part of a support of the sensor, wherein the support is configured to serve the function of a mechanical and/or hydraulic adaptor or interface with the aim of mounting the sensor into a pressure sensor device, particularly to allow mounting the pressure sensor into a pressure sensor device configured for mounting a sensor of the type referred to as monolithic or ceramic.

20. The method according to claim 19, further comprising the operation of associating to the support electrical connection means for the detection element, the support being configured to also serve the functions of an electrical adaptor or interface with the aim of mounting the sensor into a pressure sensor device.

\* \* \* \* \*